United States Patent [19]

Hattori

[11] Patent Number: 5,631,487
[45] Date of Patent: May 20, 1997

[54] SEMICONDUCTOR DEVICE AND MOTOR DRIVER CIRCUIT USING THE SAME

[75] Inventor: Masayuki Hattori, Tokyo, Japan

[73] Assignee: NEC Corporation, Tokyo, Japan

[21] Appl. No.: 537,981

[22] Filed: Oct. 2, 1995

Related U.S. Application Data

[63] Continuation of Ser. No. 282,018, Aug. 1, 1994, abandoned.

[30] Foreign Application Priority Data

Jul. 30, 1993 [JP] Japan .................. 5-189932

[51] Int. Cl.⁶ .................................. H01L 29/76
[52] U.S. Cl. .................. 257/394; 257/328; 257/400
[58] Field of Search .................. 257/400, 328, 257/341, 376, 394, 139, 138, 140, 142, 143, 335, 336, 338, 339

[56] References Cited

U.S. PATENT DOCUMENTS

| | | | |
|---|---|---|---|
| 3,719,864 | 3/1973 | Taniguchi et al. | 257/336 |
| 4,145,700 | 3/1979 | Jambotkar | 257/341 |
| 4,374,455 | 2/1983 | Goodman | 437/38 |
| 4,933,730 | 6/1990 | Shirato | 257/328 |
| 5,072,267 | 10/1991 | Hattori | 257/338 |
| 5,121,176 | 6/1992 | Quigg | 257/145 |
| 5,144,401 | 9/1992 | Ogura et al. | 257/142 |
| 5,204,593 | 4/1993 | Ueki | 369/44.28 |

FOREIGN PATENT DOCUMENTS

| | | |
|---|---|---|
| 56-73472 | 6/1981 | Japan . |
| 57-42164 | 3/1982 | Japan . |
| 58-175872 | 10/1983 | Japan . |

Primary Examiner—Donald T. Hajec
Assistant Examiner—Mark Tremblay
Attorney, Agent, or Firm—Sughrue, Mion, Zinn, Macpeak & Seas

[57] ABSTRACT

In a semiconductor device including a field effect transistor comprising a base area, a source area, a drain area and a gate area provided on a channel forming area via a gate insulating area, the base area portion being sandwiched by the source area and the drain area, there is provided a drain electrode contacting the drain area, a source electrode contacting only the source area and a gate electrode contacting the gate area. Because this arrangement does not incorporate a parasitic diode, it can be used in a system utilizing the back electromotive force of the motor, in which a reverse current blocking diode is not included and a highly efficient driver circuit can be arranged. Further, there is provided a motor driver circuit utilizing such a semiconductor device.

7 Claims, 4 Drawing Sheets

SEMICONDUCTOR DEVICE AND MOTOR DRIVER CIRCUIT USING THE SAME

This is a continuation of application Ser. No. 08/282,018 filed Aug. 1, 1994 now abandoned.

BACKGROUND OF THE INVENTION

The present invention relates to a semiconductor device and, more particularly, to a semiconductor device for driving a spindle motor of a hard disk apparatus utilizing back electromotive force of a motor. The present invention also relates to a motor driver circuit using the above-mentioned semiconductor device.

FIG. 1 is a schematic longitudinal cross-sectional view of a conventional output field effect transistor, in which reference numeral 1 denotes a well base area, 2 a field oxide film, 3 a channel stopper area, 4 a high density base area, 5 a base area, 6 a source area, 7 a high density drain area, 8 a drain area, 9 a source electrode, 10 a drain electrode, 11 a gate polysilicon electrode, 12 a interlayer insulating film and 13 a semiconductor substrate.

In the field effect transistor as above, since the source electrode 9 contacts both the source area 6 and the high density base area 4, a parasitic bipolar transistor formed with the source area 7 (emitter) and the base area 5 (base) and the well base area 1 (collector) is prevented from operating, which is, however, undesirable because the current density is increased. Further, if the voltage applied between the drain and the source is increased, the parasitic transistor can be turned on.

In order to prevent such an undesirable phenomenon, as shown in, for example, JPA 56-7347, an attempt has been made to increase the carrier density in the base area other than the channel area to make the parasitic transistor difficult to turn on.

Such a field effect transistor has been widely used in the driver circuit for driving the motor because the current loss can be made small as compared with the ordinary output bipolar transistor.

As such driver circuit, a circuit as shown in FIG. 2 has been widely used. In FIG. 2, the driver circuit comprises a first portion provided between the spindle motor 42 and a control circuit 20A for controlling the same and a second portion provided between a voice coil motor 45 and a control circuit 20B for controlling the same. The first portion is connected to the output end of the control circuit 20A via the input terminals 27 through 32 of the spindle motor and also to the spindle motor 42 via the input terminals 39 through 41 of the spindle motor. Numeral 21 denotes the input terminal of the control circuit 20A.

On the other hand, the second portion of the driver circuit is connected to the output end of the control circuit 20B via the input terminals 33 through 38 of the voice coil motor, and also to the voice coil motor 45 through the input terminals 53, 54 of the voice coil motor. Incidentally, numeral 22 denotes the input terminal of the control circuit 20B, 23 a power supply terminal and 26 a grounded terminal.

The first portion has a bridge circuit formed with two sets of MOS transistors 46, 47, 48 and 49, 50, 51, and the drain of the first set of MOS transistors 46, 47, 48 is connected in common to the supply terminal 24 for the spindle motor through a diode 58, and the source is connected to the input terminals 39 through 41 of the spindle motor respectively. On the other hand, the source of the second set of MOS transistors 49, 50, 51 is connected in common to the grounding terminal 26, and the drain is connected to the input terminals 39 through 41 of the spindle motor respectively.

Similarly, the second portion also has a bridge circuit formed with two sets of MOS transistors 62, 63, 64 and 65, 66, 67, and the drain of the first set of MOS transistors 62, 63, is connected in common to the power supply terminal 25 for the voice coil motor. The source of the MOS transistors 62, 64 is connected to the input terminal 53 of the voice coil motor and the source of the MOS transistor 63 is connected to the input terminal 54 of the voice coil motor. On the other hand, the source of the second set of MOS transistors 65, 66, 67 is connected in common to the grounding terminal 26. Further, the drain of the MOS transistor 64 is connected to the power supply terminal 24 for the voice coil motor via the foregoing diode 58. Sign 22 denotes the input terminal of the voice coil motor control circuit 20B.

In the hard disk apparatus, when the power supply voltage of the spindle motor is reduced, it has been generally practiced that the voice coil motor is returned (retracted) to the starting position by utilizing the back electromotive force of the spindle motor. To this end, it is indispensable to provide a diode 58 for preventing reverse current for the conventional driver circuit utilizing the MOS transistor in order to prevent the reverse current of the back electromotive power caused by the parasitic diode of the MOS transistor to the power supply.

To be more specific, if a conventional semiconductor device shown in FIG. 1 is used in a three-phase driver circuit of FIG. 2, which drives the spindle motor of the hard disk apparatus and which allows the back electromotive force of the motor to be utilized, the following problems will occur. That is, according to the conventional semiconductor device, since the parasitic diode is formed between the drain and the source of the MOS transistor, the back electromotive force generating through rotation of the motor flows toward the power supply through the parasitic diode formed to the transistors 46 through 48, 64 connected to the power supply side. In order to prevent this reverse current, it becomes necessary to provide a diode 58.

However, this insertion of the diode causes voltage drop. For example, if the power supply voltage is 3 V, then the voltage drop on the order of 0.5 V will occur between both ends of the inserted diode. As a result, a necessary voltage could not be applied to the motor.

Accordingly, an object of the present invention is to provide a semiconductor device improved so that the formation of the foregoing parasitic diode can be effectively avoided.

Another object of the present invention is to provide a motor driver circuit adapted for the hard disk apparatus which is provided with the improved semiconductor device.

SUMMARY OF THE INVENTION

According to the present invention, there is provided a semiconductor device including a field effect transistor comprising a second conductivity type well base area formed on one major surface of a first conductivity type semiconductor substrate, a first conductivity type base area provided on the surface of said well base area, said second conductivity type source area provided in position on the surface within said well base area and said second conductivity type drain area provided in position on the surface within said well base area and a gate area provided via a gate insulating film on a channel forming area comprising a base area portion sandwiched by said source area and said drain area comprising a drain electrode contacting said drain area, a source electrode contacting only said source area and a gate electrode contacting said gate area.

To be more specific, since the parasitic bipolar transistor becomes easy to turn on under the condition in which a high voltage is applied between the drain and the source as compared with the conventional MOS transistor, the semiconductor device according to the present invention is arranged to utilize only the transistor at one side of the bridge to switch only the excitation phase. With this circuit arrangement, it becomes possible to use the semiconductor device according to the present invention under the condition in which the parasitic bipolar transistor does not turn on, and a field effect transistor with the parasitic diode between the source and the drain eliminated can be realized. Further, the resistance turned on in the forward direction can be held as in the conventional MOS transistor.

That is, according to the present invention, a double diffusion type field effect transistor can be realized with the parasitic diode eliminated between the drain and the source. In consequence, if the semiconductor device according to the present invention is applied to the motor driver circuit adapted for, for example, the hard disk apparatus, which utilizes the back electromotive force, a reverse current blocking diode can be eliminated and the power can be efficiently supplied to the motor. As a result, by making the field effect transistor perform only the operation of switching the phase, in the circuit lowered in voltage to, especially, 3 V, a field effect transistor of low power dissipation which can be achieved by parasitic diode, which has not been able to realize according to the conventional semiconductor device, can be utilized as the output stage of the driver circuit, thus allowing a high performance of the device to be realized.

DESCRIPTION OF THE PREFERRED EMBODIMENTS

Figure 3:
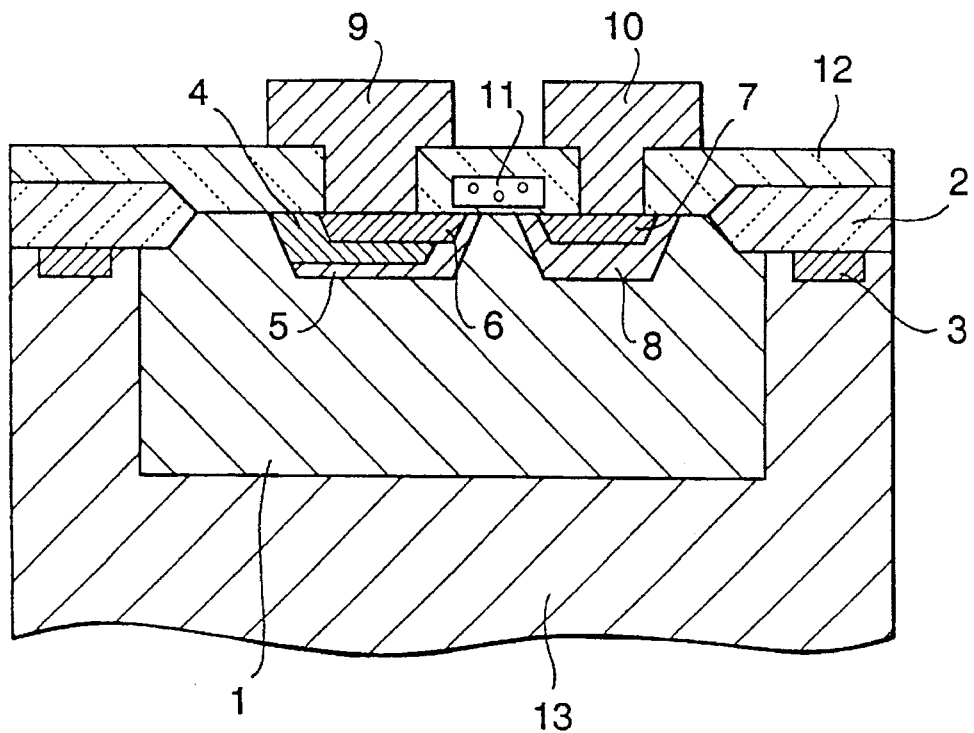
FIG. 3 is partial longitudinal circuit of the semiconductor device according to a first embodiment of the present invention.

Referring now to the specific embodiment of the present invention with reference to the accompanying drawings, FIG. 3 illustrates a horizontal type field effect transistor according to a first embodiment of the present invention, in which sign 1 denotes a well base area, 2 a field oxide film, 3 a channel stopper area, 4 a high density base area, 5 a base area, 6 a source area, 7 a high density drain area, 8, a drain area, 9 a source area, 10 a drain electrode, 11 a gate electrode, 12 an interlayer insulation film and 13 a semiconductor substrate. More specifically, the second conductivity type well base area is formed on one major surface of a first conductivity type semiconductor substrate 13, and on the surface of this well base, a first conductivity type base area 5 and a second conductivity drain area 8 are formed and, on the surface of this base area 5, the second conductivity type source area 6 is provided. Further, at the base area 5 at a channel forming area 20 sandwiched by the same and the drain area, a gate area is provided via a gate insulating film, and the gate electrode 11 comprising a polysilicon is connected to this gate area.

Figure 1:
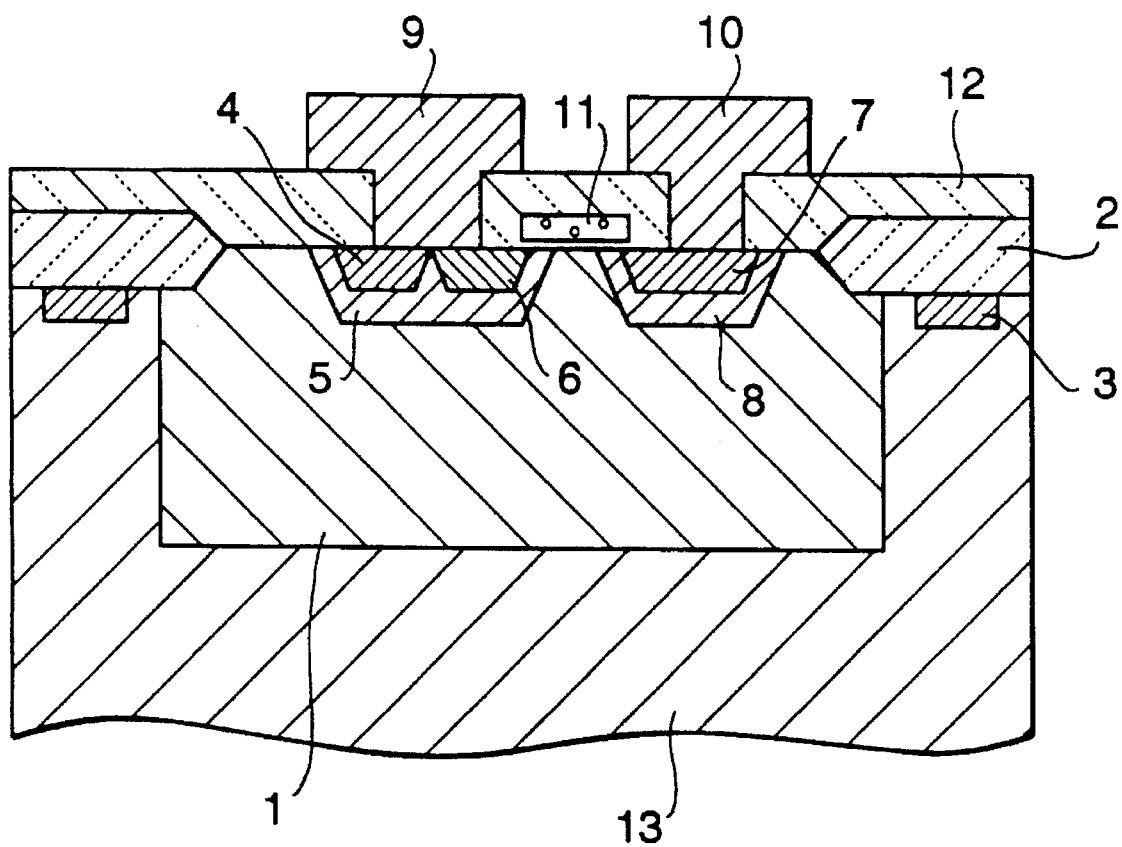
FIG. 1 is a partial cross-sectional view of a conventional semiconductor device.

As can be seen as compared with FIG. 1, the arrangement of the semiconductor device shown in FIG. 3 differs from that of FIG. 1 only in the following point. That is, it is arranged so that the drain electrode 10 is taken from the drain area 8, the source electrode 9 from only the source area 6 and the gate electrode 11 from the gate area. In other words, according to the conventional semiconductor device, the source electrode is taken from both of the base area and the source area while in the semiconductor device of the present invention it is taken from only the source area.

In such an arrangement, the parasitic diode is not generated between the drain and the source. Accordingly, the foregoing defects caused by the generation of the parasitic diode can be eliminated. However, depending on the condition, there is also a case in which the parasitic bipolar transistor tends to turn on. However, this tendency can be effectively suppressed by providing the high density base area within the base area.

Figure 4:
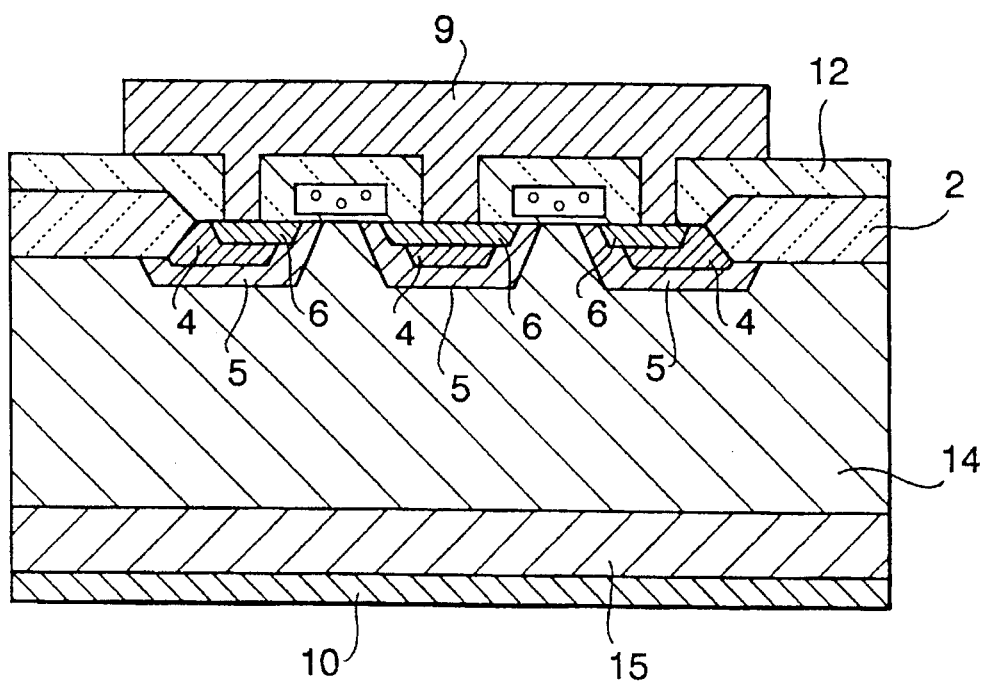
FIG. 4 is a partial longitudinal view of the semiconductor device according to a second embodiment of the present invention.

FIG. 4 illustrates a horizontal type field effect transistor according to the second embodiment of the present invention which allows the drain electrode to be taken from the rear side. In this embodiment, the high density drain area 15 is formed on one major surface or the rear surface of the low density drain area 14 formed on the substrate, a high density drain area 15 is formed, in contact with which the drain electrode is provided. On the other hand, three base areas 5 are provided on the other major surface of the low density drain area 14 and, on each base area 5, the high density base area 4 and the source area 6 are provided. Also in this embodiment, the source electrode 9 contacts only the source area 6 without contacting the base area 4.

As in FIG. 3, between the adjacent base areas 5 at the channel forming area sandwiched by the same and the base area 5, a gate area (not shown) is provided via the gate insulating film and, at this gate area, a gate electrode (not shown) comprising the polysilicon is connected.

Figure 5:
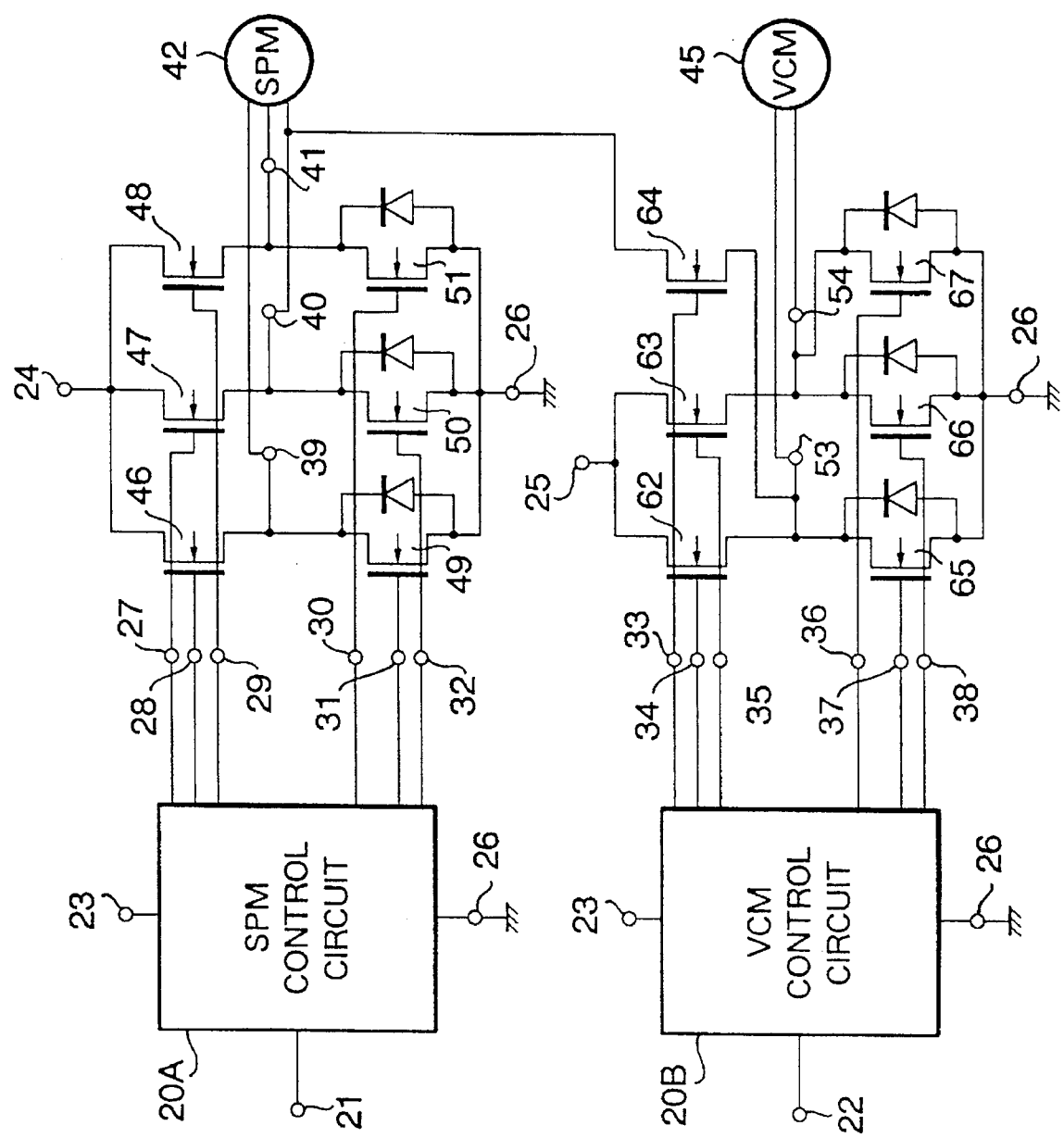
FIG. 5 is a circuit diagram illustrating a circuit for driving a motor adapted for a hard disk apparatus which is arranged by using the semiconductor device according to the present invention.

FIG. 5 illustrates a motor driver circuit comprising the semiconductor device of the present invention which is used for the hard disk apparatus. In FIG. 5, 20A denotes a control circuit for controlling a spindle motor 42, 20B a control circuit for controlling a voice coil motor 45, 21, 22 each an input terminal, 25 a power supply terminal, 26 a grounding terminal, 27 through 32 each an input terminal of the spindle motor 42, 33 through 38 each an input terminal of the voice coil motor 45, 46 through 48 each MOS transistor of the present invention, 53, 54 each an input terminal of the voice coil motor and 62 through 64 each a MOS transistor of the present invention.

Figure 2:
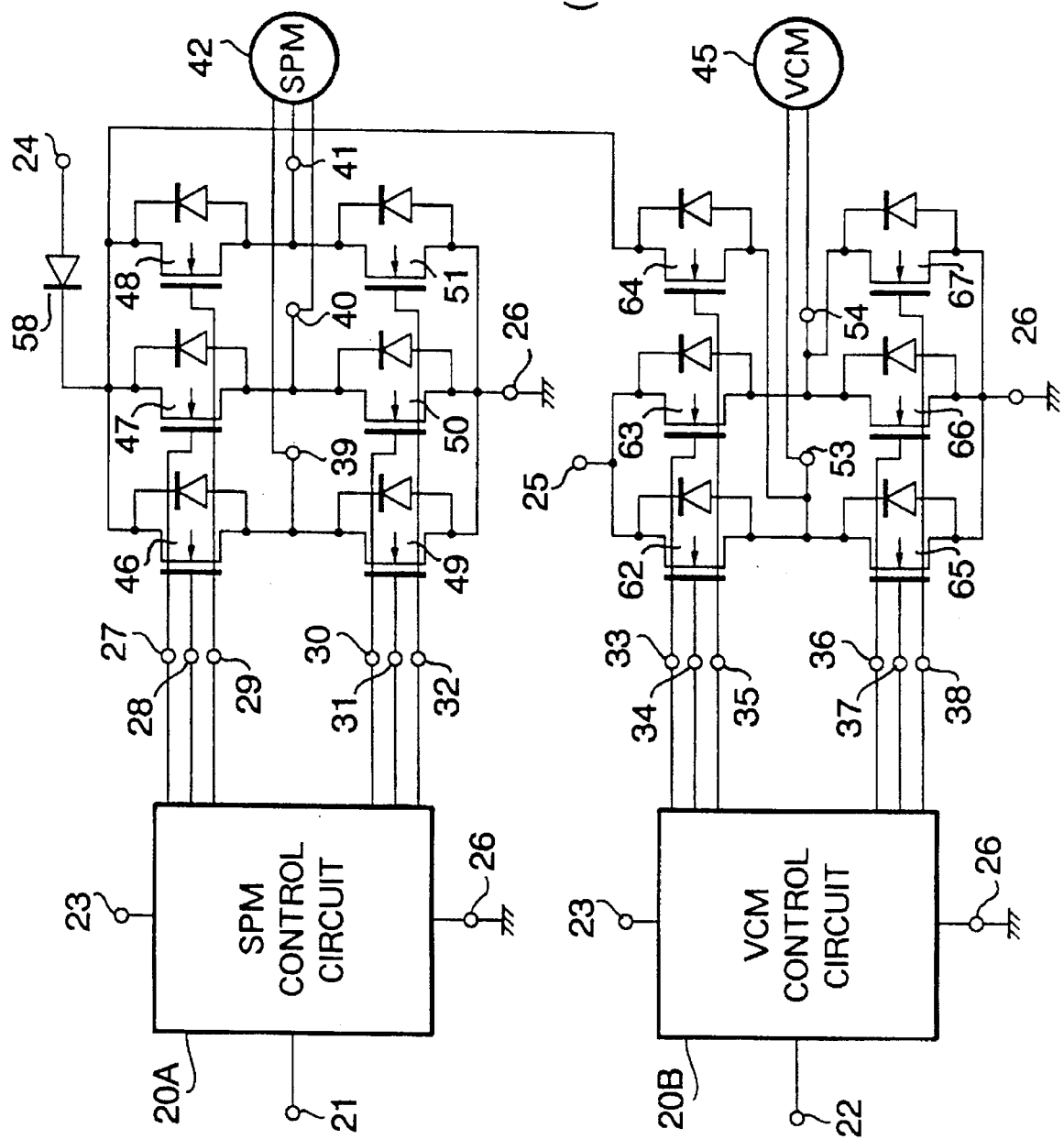
FIG. 2 is a circuit diagram of a circuit for driving a motor adapted for a hard disk device which is arranged with the semiconductor device shown in FIG. 1.

This motor driver circuit differs from the conventional motor driver circuit shown in FIG. 2 basically in that the diode provided between the drains of the MOS transistors 46 through 48 and 64 is eliminated.

With the motor driver circuit of the present invention which has such an arrangement, since there is no reverse current blocking diode provided, power can be efficiently provided to the motor.

What is claimed is:

1. A semiconductor device including a field effect transistor formed in a semiconductor substrate comprising:
   a first base area;
   a second base area provided in said first base area;
   a drain area provided in said first base area;
   a source area provided in said second base area;
   a third base area provided in said second base area and having a higher density than that of said second base area;
   an insulation film provided between said source area and said drain area on said semiconductor substrate;
   a gate electrode provided on said insulation film;
   a drain electrode connected to said drain area; and
   a source electrode contacting said source area and not electrically contacting said third base area.

2. The semiconductor device claimed in claim 1 further comprising a second drain area having a higher density than that of said first drain area.

3. The semiconductor device claimed in claim 1 wherein said third base area is not beneath said gate electrode.

4. A semiconductor device including a field effect transistor comprising:
   a semiconductor substrate constituting a drain area;
   a first base area provided in the surface of said drain area;
   a second base area provided in said first base area and having a higher density than that of said first base area;
   a source area provided in said first base area;
   an insulation film provided on said first base area;
   a gate electrode provided on said insulation film;
   a drain electrode connected to said drain area; and
   a source electrode contacting to said source area and not electrically contacting said second base area;
   wherein said drain electrode is provided on the lower surface of said semiconductor substrate.

5. The semiconductor device claimed in claim 4 wherein said second base area is not beneath said gate electrode.

6. A motor driver circuit comprising:
   a bridge circuit comprising MOSFET's and connected between a spindle motor control circuit and a voice coil motor control circuit;
   said MOSFET's of said bridge circuit at the input stage being connected directly to a power supply without a diode;
   one of said MOSFET's of said bridge circuit being connected to an input of said spindle motor;
   said MOSFET's at the input stages of said bridge circuits for said spindle motor and said voice coil motor being not connected to any protective diode;
   wherein said MOSFET's are set forth in claim 1.

7. A motor driver circuit comprising:
   a bridge circuit comprising MOSFET's and connected between a spindle motor control circuit and a voice coil motor control circuit;
   said MOSFET's of said bridge circuit at the input stage being connected directly to a power supply without a diode;
   one of said MOSFET's of said bridge circuit being connected to an input of said spindle motor;
   said MOSFET's at the input stages of said bridge circuits for said spindle motor and said voice coil motor being not connected to any protective diode;
   wherein said MOSFET's are set forth in claim 4.

* * * * *